(12) United States Patent
Hidaka et al.

(10) Patent No.: US 8,809,247 B2
(45) Date of Patent: Aug. 19, 2014

(54) CLEANING COMPOSITION AND METHOD FOR CLEANING SUBSTRATE FOR ELECTRONIC DEVICE

(75) Inventors: Makoto Hidaka, Sumida-ku (JP); Taku Ogura, Sumida-ku (JP)

(73) Assignee: LION Corporation (JP)

( * ) Notice: Subject to any disclaimer, the term of this patent is extended or adjusted under 35 U.S.C. 154(b) by 141 days.

(21) Appl. No.: 12/867,468

(22) PCT Filed: Feb. 13, 2009

(86) PCT No.: PCT/JP2009/052383
§ 371 (c)(1),
(2), (4) Date: Aug. 12, 2010

(87) PCT Pub. No.: WO2009/102004
PCT Pub. Date: Aug. 20, 2009

(65) Prior Publication Data
US 2010/0319735 A1 Dec. 23, 2010

(30) Foreign Application Priority Data

Feb. 15, 2008 (JP) ................................. 2008-035165

(51) Int. Cl.
*C11D 3/04* (2006.01)
*H01L 21/02* (2006.01)
*C11D 3/39* (2006.01)
*C11D 7/10* (2006.01)
*C11D 7/26* (2006.01)
*C11D 11/00* (2006.01)
*H01L 29/16* (2006.01)

(52) U.S. Cl.
CPC ........ *H01L 21/02052* (2013.01); *C11D 3/3947* (2013.01); *C11D 7/10* (2013.01); *C11D 7/265* (2013.01); *C11D 11/0047* (2013.01); *H01L 29/1608* (2013.01)
USPC ............................. 510/175; 510/176; 134/1.3

(58) Field of Classification Search
CPC ......................... C11D 11/0047; C11D 3/3947
USPC .................................... 510/175, 176; 134/1.3
See application file for complete search history.

(56) References Cited

U.S. PATENT DOCUMENTS 3,383,319 A 5/1968 Black
3,666,648 A 5/1972 Lasky et al.
(Continued)

FOREIGN PATENT DOCUMENTS

EP 0 522 547 1/1993
EP 0 678 571 A2 10/1995
(Continued)

OTHER PUBLICATIONS

Kern et al. "Cleaning Solutions Based on Hydrogen Peroxide for use in Silicon Semiconductor Technology." *RCA Review*. Jun. 1970. pp. 187-205.

(Continued)

*Primary Examiner* — Gregory Webb
(74) *Attorney, Agent, or Firm* — Merchant & Gould P.C.

(57) ABSTRACT

A cleaning composition which is capable of removing both organic soiling and particulate soiling adhered to a substrate for an electronic device with a high degree of cleanliness, and which also has minimal impact on the environment, as well as a method of cleaning a substrate for an electronic device. The present invention relates to a cleaning composition used for cleaning a substrate for an electronic device including a water-soluble salt (A) containing a transition metal, a chelating agent (B) and a peroxide (C), wherein the amount of the chelating agent (B) is not less than 0.5 molar equivalents relative to the amount of the water-soluble salt (A) containing a transition metal.

21 Claims, 1 Drawing Sheet

(56) References Cited

U.S. PATENT DOCUMENTS

| | | | |
|---|---|---|---|
| 6,066,609 A | 5/2000 | Martin et al. | |
| 6,518,162 B2* | 2/2003 | Ono et al. | 438/612 |
| 6,777,335 B2* | 8/2004 | Hasegawa | 438/691 |
| 7,022,608 B2* | 4/2006 | Sun et al. | 438/691 |
| 7,452,481 B2* | 11/2008 | Suzuki et al. | 252/79.1 |
| 7,513,920 B2* | 4/2009 | Siddiqui et al. | 51/307 |
| 7,541,322 B2* | 6/2009 | Ikemoto et al. | 510/175 |
| 2002/0028585 A1 | 3/2002 | Chung et al. | |
| 2002/0058412 A1* | 5/2002 | Ono et al. | 438/678 |
| 2002/0068454 A1* | 6/2002 | Sun et al. | 438/692 |
| 2002/0098701 A1* | 7/2002 | Hasegawa | 438/692 |
| 2003/0216049 A1* | 11/2003 | Sun et al. | 438/697 |
| 2006/0255314 A1* | 11/2006 | Suzuki et al. | 252/79.1 |
| 2006/0270573 A1* | 11/2006 | Ikemoto et al. | 510/175 |

FOREIGN PATENT DOCUMENTS

| | | |
|---|---|---|
| JP | A 05-198546 | 8/1993 |
| JP | 5-262710 | 10/1993 |
| JP | 6-216098 | 8/1994 |
| JP | 6-216098 A | 8/1994 |
| JP | 2000-252250 | 9/2000 |
| JP | 2002-50604 | 2/2002 |
| JP | 2002-155382 | 5/2002 |
| JP | 2002-231677 | 8/2002 |
| JP | A 2006-128708 | 5/2006 |
| WO | WO 2007/044446 A1 | 4/2007 |

OTHER PUBLICATIONS

Taiwanese Office Action for Application No. TW 098104670 (Aug. 19, 2013).

Supplementary European Search Report from EP 09 71 0545 dated Dec. 1, 2011.

Kern et al. "Cleaning Solutions Based on Hydrogen Peroxide for use in Silicon Semiconductor Technology," *RCA Review*, Jun. 1970, pp. 187-206.

* cited by examiner

CLEANING COMPOSITION AND METHOD FOR CLEANING SUBSTRATE FOR ELECTRONIC DEVICE

This application is a National Stage Application of PCT/JP2009/052383, filed 13 Feb. 2009, which claims benefit of Serial No. 2008-035165, filed 15 Feb. 2008 in Japan and which applications are incorporated herein by reference. To the extent appropriate, a claim of priority is made to each of the above disclosed applications.

TECHNICAL FIELD

The present invention relates to a cleaning composition that is ideal for cleaning a substrate for an electronic device, and a method of cleaning a substrate for an electronic device.

BACKGROUND ART

In electronic devices, very fine soiling can cause operating faults or a deterioration in performance, and therefore it is desirable that microscopic soiling on substrates for electronic devices such as semiconductor substrates, hard disk substrates and display substrates used for liquid crystal panels and the like is effectively completely removed. Accordingly, in precision cleaning processes used within the industrial field, any soiling adhered to substrates for electronic devices must be removed with a very high degree of cleanliness.

Examples of the soiling include organic soiling derived from substrate fixing agents such as waxes and the like, particulate soiling derived from polishing agents such as colloidal silica, metal soiling derived from metals such as Fe, Na or Cu, or metal ions thereof, and mixtures of these different soiling types.

A multitude of precision cleaning techniques have been proposed for achieving the required degree of cleanliness, depending on the type of electronic device substrate that is to be cleaned and the nature of the soiling adhered to the electronic device substrate.

For example, in the case of precision cleaning of semiconductor substrates, a method that involves performing cleaning treatments with hydrogen peroxide and a strong acid (such as sulfuric acid or hydrochloric acid), hydrogen peroxide and an alkali (such as ammonia), and hydrofluoric acid, the so-called "RCA cleaning" method, is widely used (for example, see Non-Patent Document 1).

Further, an example of another cleaning method besides the RCA cleaning method described above is a cleaning method in which the oxidizing power of ozone is used to remove organic soiling (for example, see Patent Document 1).
[Non-Patent Document 1]
RCA Review, p. 187, June 1970
[Patent Document 1]
Japanese Laid-Open Patent Application No. 2002-231677

DISCLOSURE OF INVENTION

Problems to be Solved by the Invention

However, in "RCA cleaning", the strong acid and alkali are used at high concentration levels and at high temperatures, and the hydrofluoric acid used is a highly toxic aqueous solution, meaning workability is poor, and corrosion-resistant facilities and exhaust facilities must be provided.

Furthermore, "RCA cleaning" generally involves performing cleaning treatments with hydrogen peroxide and a strong acid, hydrogen peroxide and an alkali, and hydrofluoric acid (namely, a plurality of cleaning steps), followed by a process in which a plurality of rinsing treatments are performed using large volumes of pure water (a multi-tank immersion process), and therefore has a significant impact on the environment.

On the other hand, cleaning methods that use the oxidizing power of ozone tend to produce an unsatisfactory degree of cleanliness for particulate soiling.

Furthermore, in recent tears, as circuit patterns have become increasingly finer and new materials such as compound semiconductors have started to be introduced, "RCA cleaning" has become unable to satisfactorily remove all organic soiling and particulate soiling adhered to electronic device substrates, making it difficult to satisfy the quality levels required in precision cleaning.

Accordingly, precision cleaning in the industrial field requires a novel precision cleaning method capable of replacing conventional cleaning methods.

The present invention takes the above circumstances into consideration, with an object of providing a cleaning composition which is capable of removing both organic soiling and particulate soiling adhered to a substrate for an electronic device with a high degree of cleanliness, and which also has minimal impact on the environment, as well as providing a method of cleaning a substrate for an electronic device.

Means to Solve the Problems

As a result of intensive investigation, the inventors of the present invention propose the following aspects in order to achieve the object described above.

In other words, the present invention provides a cleaning composition used for cleaning a substrate for an electronic device, wherein the cleaning composition includes a water-soluble salt (A) containing a transition metal, a chelating agent (B) and a peroxide (C), and the amount of the chelating agent (B) is not less than 0.5 molar equivalents relative to the amount of the water-soluble salt (A) containing a transition metal.

In the cleaning composition of the present invention, the chelating agent (B) is preferably a polycarboxylic acid-based compound.

Further, in the cleaning composition of the present invention, the pH is preferably 8 or greater.

Further, in the cleaning composition of the present invention, the combined mass of the water-soluble salt (A) containing a transition metal and the chelating agent (B) preferably represents not less than 0.01% by mass of the entire composition.

Furthermore, in the cleaning composition of the present invention, the substrate for an electronic device is preferably a semiconductor substrate, a hard disk substrate or a display substrate.

The material of the semiconductor substrate is preferably silicon, silicon carbide, zinc oxide or sapphire.

The material of the hard disk substrate is preferably a glass, a mixture of nickel and phosphorus, a mixture of nickel and iron, or aluminum.

The material of the display substrate is preferably a glass.

Furthermore, a method of cleaning a substrate for an electronic device according to the present invention involves using the above cleaning composition of the present invention.

In the method of cleaning a substrate for an electronic device according to the present invention, an ultrasonic treatment is preferably performed during cleaning.

Further, the method of cleaning a substrate for an electronic device according to the present invention preferably includes a step of performing cleaning using an acid following completion of the cleaning using the cleaning composition of the present invention.

Effect of the Invention

The present invention is able to provide a cleaning composition which is capable of removing both organic soiling and particulate soiling adhered to a substrate for an electronic device with a high degree of cleanliness, and which also has minimal impact on the environment, as well as providing a method of cleaning a substrate for an electronic device.

BEST MODE FOR CARRYING OUT THE INVENTION

Cleaning Composition

Figure 1A:
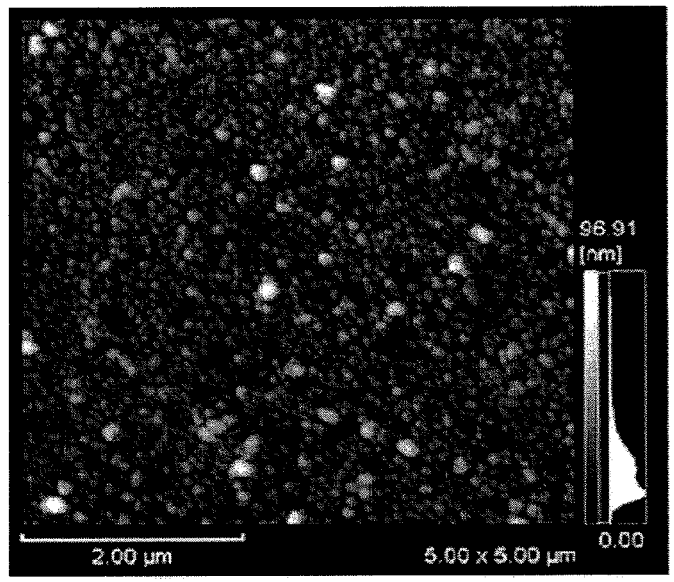
FIG. 1A is a diagram illustrating a shape image of an AFM observation image of an uncleaned Si substrate following a mirror polishing treatment.

The cleaning composition of the present invention is used for cleaning a substrate for an electronic device, and includes a water-soluble salt (A) containing a transition metal, a chelating agent (B), and a peroxide (C).

[Water-Soluble Salt (A) Containing a Transition Metal]

In the water-soluble salt (A) containing a transition metal (hereafter frequently referred to as "the component (A)"), examples of the transition metal include elemental metals formed from metal elements from groups 3 to 11 of the periodic table. Of these, in terms of achieving superior cleaning performance relative to both organic soiling and particulate soiling adhered to electronic device substrates, copper, iron, manganese, cobalt, nickel and silver are preferred, copper, iron, manganese and cobalt are more preferred, and copper is particularly desirable.

Examples of the water-soluble salt include sulfates, chlorides, nitrates and bromides, and in terms of achieving superior solubility in solvents such as water, sulfates, chlorides and nitrates are preferred, and sulfates are particularly desirable.

Specific examples of the component (A) include sulfates such as copper sulfate, iron sulfate, manganese sulfate, cobalt sulfate, nickel sulfate and silver sulfate, chlorides such as copper chloride, iron chloride, manganese chloride, cobalt chloride and nickel chloride, nitrates such as copper nitrate, iron nitrate, manganese nitrate, cobalt nitrate, nickel nitrate and silver nitrate, and bromides such as copper bromide, iron bromide, manganese bromide, cobalt bromide and nickel bromide.

Further, in addition to the compounds listed above, hydrates of the above compounds may also be used as the component (A).

As the component (A), a single salt may be used alone, or a combination of two or more different salts may be used.

[Chelating Agent (B)]

Examples of the chelating agent (B) (hereafter frequently referred to as "the component (B)") include aminocarboxylate salts such as nitrilotriacetates, ethylenediaminetetraacetates, β-alaninediacetates, glutamic acid diacetates, aspartic acid diacetates, methylglycinediacetates, iminodisuccinates and diethylenetriaminepentaacetates, hydroxyaminocarboxylate salts such as serine diacetates, hydroxyiminodisuccinates, hydroxyethylethylenediaminetriacetates and dihydroxyethylglycine salts, hydroxycarboxylate salts such as hydroxyacetates, citrates and gluconates, cyclocarboxylate salts such as pyromellitates, benzopolycarboxylates and cyclopentanetetracarboxylates, ether carboxylate salts such as carboxymethyltartronates, carboxymethyloxysuccinates, oxydisuccinates, tartaric acid monosuccinates and tartaric acid disuccinates, polymeric chelating agents such as maleic acid-acrylic acid copolymers and carboxymethylated polyethyleneimines, and phosphorus-based chelating agents such as sodium tripolyphosphate, hydroxyethane diphosphonic acid and pyrophosphoric acid.

Of these, in terms of achieving superior cleaning performance relative to both organic soiling and particulate soiling adhered to electronic device substrates, the component (B) is preferably a polycarboxylic acid-based compound.

Of these polycarboxylic acid-based compounds, particularly preferred compounds include aminopolycarboxylate salts such as nitrilotriacetates, ethylenediaminetetraacetates, β-alaninediacetates, glutamic acid diacetates, aspartic acid diacetates, methylglycinediacetates, iminodisuccinates and diethylenetriaminepentaacetates, hydroxyaminopolycarboxylate salts such as serine diacetates, hydroxyiminodisuccinates and hydroxyethylethylenediaminetriacetates, hydroxypolycarboxylate salts such as citrates, cyclopolycarboxylate salts such as pyromellitates, benzopolycarboxylates and cyclopentanetetracarboxylates, ether polycarboxylate salts such as carboxymethyltartronates, carboxymethyloxysuccinates, oxydisuccinates, tartaric acid monosuccinates and tartaric acid disuccinates, and polymeric chelating agents such as maleic acid-acrylic acid copolymers and carboxymethylated polyethyleneimines.

Examples of the salt include alkali metal salts such as sodium salts and potassium salts, and alkanolamine salts such as monoethanolamine salts and diethanolamine salts, and of these, sodium salts and potassium salts are particularly desirable.

As the component (B), a single chelating agent may be used alone, or a combination of two or more different chelating agents may be used.

In the cleaning composition of the present invention, the amount of the component (B) must be not less than 0.5 molar equivalents relative to the amount of the component (A), and is preferably 1.0 molar equivalents or greater. Provided the amount of the component (B) is at least 0.5 molar equivalents relative to the amount of the component (A), a high degree of cleanliness can be achieved relative to both organic soiling and particulate soiling adhered to electronic device substrates.

Larger amounts of the component (B) are preferred in terms of suppressing residues of the transition metal released from the component (A) on the electronic device substrate, although the upper limit for the amount of the component (B) is typically not more than 100 molar equivalents, and preferably not more than 10 molar equivalents, relative to the amount of the component (A). Provided the amount of the component (B) is not more than this upper limit, organic soiling of the electronic device substrate by residues of the component (B) can be satisfactorily suppressed.

The ratio of the amount of the component (B) relative to the component (A) can also be represented by the molar ratio [(B)/(A)].

The combined mass of the component (A) and the component (B) preferably represents not less than 0.01% by mass, and more preferably 0.01 to 5% by mass, of the entire cleaning composition of the present invention.

Provided the combined mass of the component (A) and the component (B) represents at least 0.01% by mass, superior cleaning performance can be achieved relative to both organic soiling and particulate soiling adhered to electronic device substrates. Further, provided the combined mass is not more than 5% by mass, the foaming caused by decomposition of the hydrogen peroxide generated from the component (C) described below in an aqueous solution can be appropriately suppressed, and accelerated deactivation of the hydrogen peroxide can be inhibited.

[Peroxide (C)]

In the description and claims of the present invention, the term "peroxide" is deemed to include hydrogen peroxide.

As the peroxide (C) (hereafter frequently referred to as "the component (C)"), either hydrogen peroxide or a compound that generates hydrogen peroxide in an aqueous solution may be used. Specific examples of the component (C) include hydrogen peroxide, percarbonic acid and perboric acid, or alkali metal salts (such as sodium salts and potassium salts) or ammonium salts of these acids. Of these, in terms of achieving superior cleaning performance relative to both organic soiling and particulate soiling adhered to electronic device substrates, hydrogen peroxide, sodium percarbonate and sodium perborate are preferred, and hydrogen peroxide is particularly desirable.

As the component (C), a single compound may be used alone, or a combination of two or more different compounds may be used.

The amount of the component (C) within the cleaning composition of the present invention may be altered appropriately in accordance with the type of electronic device substrate that is to be cleaned and the degree of soiling adhered to the electronic device substrate, but is preferably within a range from 0.05 to 30% by mass, more preferably from 0.05 to 15% by mass, and still more preferably from 0.1 to 10% by mass. Provided the amount of the component (C) is at least 0.05% by mass, superior cleaning performance can be achieved relative to both organic soiling and particulate soiling adhered to electronic device substrates. Further, provided the amount of the component (C) is not more than 30% by mass, and preferably not more than 15% by mass, the amount of hydrogen peroxide generated within an aqueous solution can be suppressed, enabling appropriate suppression of foaming caused by decomposition of the hydrogen peroxide.

For example, when cleaning a silicon carbide substrate that functions as a semiconductor substrate, the amount of the component (C) within the cleaning composition of the present invention is preferably within a range from 0.05 to 30% by mass, and more preferably from 0.1 to 30% by mass. Provided the amount of the component (C) is at least 0.05% by mass, a superior degree of cleanliness can be achieved for both organic soiling and particulate soiling adhered to the silicon carbide substrate. Moreover, provided the amount of the component (C) is not more than 30% by mass, the type of foaming described above can be appropriately suppressed.

As the amount of the component (C) is increased, the cleaning performance of persistent soiling improves.

[Other Components]

In the cleaning composition of the present invention, other components besides the aforementioned component (A), component (B) and component (C) may be used as required. Examples of these other components include alkali agents, solvents and surfactants and the like.

Examples of the alkali agents include inorganic alkali agents such as ammonia, potassium hydroxide and sodium hydroxide, and organic alkali agents such as tetramethylammonium hydroxide and tetraethylammonium hydroxide.

Examples of the solvents include ultra pure water, pure water, ethanol and isopropyl alcohol.

There are no particular restrictions on the surfactants that may be used, and specific examples include anionic surfactants such as linear alkylbenzenesulfonates, alkyl sulfates and alkyl ether sulfates, and nonionic surfactants such as alkylene oxide adducts of higher alcohols and pluronic surfactants.

There are no particular restrictions on the method used for preparing the cleaning composition of the present invention, and for example, the cleaning composition may be prepared by sequentially mixing each of the components using normal methods.

During preparation, the component (A) and the component (B) may be used in the form of a mixture prepared in advance by mixing the two components together and then drying the resulting mixture, or the components (A) and (B) may be added separately. Alternatively, a metal complex (complex compound or complex salt) formed by mixing together the component (A) and the component (B) may be used.

Further, the mixing sequence preferably separates the addition of the component (A) and the addition of the component (C). This suppresses decomposition of the hydrogen peroxide generated from the component (C), enabling the cleaning composition to be prepared with greater stability.

Furthermore, mixing the component (C) and the component (A) immediately prior to performing cleaning is also preferred. Further, in those cases where an alkali agent is used, the component (C) and the alkali agent are preferably mixed together immediately prior to performing cleaning. This suppresses decomposition of the hydrogen peroxide generated from the component (C), enabling the cleaning composition to be prepared with greater stability.

Moreover, besides the preparation method described above, a method may be used in which a formulation containing the component (C) and a formulation containing the component (A) are prepared in advance, and these two formulations are then mixed together at the time of cleaning. In this case, the component (B) may be included in either of the formulations.

Moreover, besides the preparation methods described above, a method may be used in which a formulation containing the component (C), a formulation containing the component (B) and a formulation containing the component (A) are prepared in advance, and these formulations are then mixed together at the time of cleaning. Furthermore, the mixing sequence preferably separates the addition of the formulation containing the component (A) and the addition of the formulation containing the component (C). This suppresses decomposition of the hydrogen peroxide generated from the component (C), enabling the cleaning composition to be prepared with greater stability.

The cleaning composition of the present invention (in neat liquid form) has a pH that is preferably 8 or greater, more preferably 8.5 or greater, and still more preferably within a range from 9 to 13. Provided the pH of the cleaning composition is 8 or greater, superior cleaning performance can be achieved relative to both organic soiling and particulate soiling adhered to electronic device substrates. The degree of cleanliness achievable for organic soiling is particularly enhanced.

The pH of the cleaning composition (in neat liquid form) represents the pH of the cleaning composition (neat liquid) after standing for 10 minutes at 25° C. immediately following preparation of the cleaning composition.

Measurement of the pH is conducted using a pH meter (product name: HM-20S, manufactured by DKK TOA Corporation) and a pH electrode (product name: GST-5211C, manufactured by DKK TOA Corporation), by immersing the pH electrode in the cleaning composition at approximately 25° C., and reading the display value 15 seconds after immersion.

Due to interactions between the components (A) to (C), the pH value of the cleaning composition of the present invention does not remain uniform following preparation. Accordingly, in the present invention, the pH of the cleaning composition (neat liquid) after standing for 10 minutes following preparation, which tends to represent a substantially uniform pH value for the cleaning composition, is measured and recorded as the pH.

(Substrate for Electronic Device)

The cleaning composition of the present invention is used for cleaning a substrate for an electronic device.

As the substrate for an electronic device, a semiconductor substrate, hard disk substrate or display substrate is preferred. The cleaning composition of the present invention is able to remove soiling adhered to these substrates with an extremely high degree of cleanliness without damaging the substrate.

Examples of the material of the semiconductor substrate include silicon, silicon carbide, zinc oxide, gallium nitride, sapphire, diamond, gallium arsenide and indium phosphide, and of these, silicon, silicon carbide, zinc oxide or sapphire is preferred.

Examples of the material of the hard disk substrate include glass, mixtures of nickel and phosphorus (Ni—P), mixtures of nickel and iron (Ni—Fe), aluminum, boron carbide and carbon, and of these, a glass, a mixture of nickel and phosphorus (Ni—P), a mixture of nickel and iron (Ni—Fe) or aluminum is preferred.

Examples of the material of the display substrate include glass and plastic, and of these, a glass is preferred.

The cleaning composition of the present invention is able to remove soiling adhered to all manner of electronic device substrates formed using the above materials with an extremely high degree of cleanliness, and is ideal as a cleaning composition for use in the precision cleaning of these substrates.

As described above, the cleaning composition of the present invention is capable of removing both organic soiling and particulate soiling adhered to a substrate for an electronic device with a high degree of cleanliness.

The reasons that this effect is obtained are not entirely clear, but are thought to include the following. The cleaning composition of the present invention includes a water-soluble salt (A) containing a transition metal, a chelating agent (B) and a peroxide (C), wherein the amount of the component (B) is not less than 0.5 molar equivalents relative to the amount of the component (A).

The component (A) and the component (B) form a metal complex (a complex compound or complex salt) either within the cleaning composition or during the cleaning process. In particular, ensuring that the amount of the component (B) is not less than 0.5 molar equivalents relative to the amount of the component (A) enables favorable formation of a metal complex. This metal complex further activates the hydrogen peroxide generated from the component (C). It is thought that, as a result, the cleaning composition of the present invention is able to remove both organic soiling and particulate soiling adhered to electronic device substrates with a high degree of cleanliness.

In the cleaning composition of the present invention, it is thought that in those cases where the cleaning composition is in the form of an aqueous solution, the metal complex described above exists in solution within the aqueous solution, whereas in those cases where the cleaning composition is in a particulate form, the metal complex forms particles, but then forms the metal complex described above when the cleaning composition is dissolved in water.

As described below, in addition to the organic soiling and particulate soiling mentioned above, metal soiling may also exist on the electronic device substrate that acts as the cleaning target. In precision cleaning, this metal soiling adhered to the electronic device substrate must also be removed with an extremely high degree of cleanliness.

The cleaning composition of the present invention intentionally uses a metal that itself requires removal as soiling, but as a result, yields a cleaning effect on organic soiling and particulate soiling that is vastly superior to that which is obtainable with conventional compositions. This cleaning effect is not obtainable with the amount of metal typically contained within the metal soiling that exists on an electronic device substrate.

The cleaning composition of the present invention is particularly suited to cleaning substrates for electronic devices.

<<Method of Cleaning Substrate for Electronic Device>>

The method of cleaning a substrate for an alkali developability according to the present invention uses the cleaning composition of the present invention described above.

There are no particular restrictions on the cleaning method employed, and examples include a method in which the cleaning composition is sprayed directly from a nozzle or the like onto the electronic device substrate that represents the cleaning target and is then wiped off the substrate, a method in which the electronic device substrate is immersed in the cleaning composition, and a method in which ultrasonic treatment is performed during cleaning.

In the method of cleaning a substrate for an electronic device according to the present invention, an ultrasonic treatment is preferably performed during cleaning. Conducting an ultrasonic treatment during cleaning yields an even more superior cleaning performance relative to both organic soiling and particulate soiling adhered to the substrate for an electronic device. The degree of cleanliness achievable for particulate soiling is particularly enhanced.

An example of the method of cleaning a substrate for an electronic device according to the present invention is described below.

First, the substrate for an electronic device that represents the cleaning target is placed in a cleaning tank fitted with an ultrasonic oscillator on the bottom surface. The substrate for an electronic device is preferably secured so as not to make contact with the bottom surface. This prevents residual soiling from occurring at the point of contact between the electronic device substrate and the bottom surface.

Next, the cleaning composition of the present invention is supplied to the tank, the substrate for an electronic device is immersed within the cleaning composition, and ultrasonic waves are generated by oscillation of the ultrasonic oscillator.

Following ultrasonic irradiation for a predetermined period, the substrate for an electronic device is removed from the cleaning composition (the above process is referred to as the "ultrasonic cleaning step").

Subsequently, the removed substrate for an electronic device is rinsed in running pure water (and preferably ultra pure water) to remove any residual cleaning composition and soiling from the electronic device substrate. This removal of residual cleaning composition and soiling from the electronic device substrate may be conducted by placing pure water (and preferably ultra pure water) in a rinse tank fitted with an ultrasonic oscillator on the bottom surface, immersing the substrate for an electronic device that has been subjected to the ultrasonic cleaning step in the pure water, and then generating ultrasonic waves by oscillation of the ultrasonic oscillator (this process is referred to as the "rinsing step").

Following completion of the rinsing step, residual pure water is removed from the substrate for an electronic device using a dryer (this process is referred to as the "drying step").

As the substrate for an electronic device, the semiconductor substrates, hard disk substrates and display substrates described above are preferred.

Furthermore, examples of the soiling on the electronic device substrate include organic soiling derived from substrate fixing agents such as wax and human bodies, particulate soiling derived from polishing agents such as colloidal silica and airborne floating particles, metal soiling derived from metals such as Fe, Na or Cu or metal ions thereof, and mixtures of these different soiling types. Of these different types of soiling, the method of cleaning a substrate for an electronic device according to the present invention is particularly effective for removing both organic soiling and particulate soiling.

There are no particular restrictions on the concentration of the cleaning composition in the ultrasonic cleaning step, and the cleaning composition may be used in undiluted form, or may be diluted with pure water (and preferably ultra pure water) or a solvent or the like.

In those cases where the cleaning composition is diluted, the dilution ratio is preferably within a range from 2- to 1,000-fold dilution, and more preferably from 2- to 100-fold dilution. Provided the dilution ratio is not higher than the upper limit of the above range, both organic soiling and particulate soiling can be removed satisfactorily.

There are no particular restrictions on the ultrasonic treatment conditions employed during the ultrasonic cleaning step, and any ultrasonic intensity and treatment time sufficient to enable satisfactory dispersion of the soiling adhered to the electronic device substrate within the cleaning composition may be used.

For example, the oscillation frequency of the ultrasonic oscillator is preferably not less than 200 kHz and not more than 2 MHz, and is more preferably not less than 500 kHz and not more than 1 MHz. Provided this oscillation frequency is at least 200 kHz, the mechanical force generated by the ultrasonic waves is not too large, meaning cleaning can be performed without damaging the electronic device substrate. Moreover, provided the ultrasonic frequency is not more than 2 MHz, the removal effect, particularly on particulate soiling, can be improved.

There are no particular restrictions on the treatment time for the ultrasonic cleaning, although a time of 1 to 30 minutes is preferred, and a time of 5 to 15 minutes is particularly desirable.

Further, during the ultrasonic cleaning, although there are no particular restrictions on the temperature within the cleaning tank, the temperature is preferably within a range from 5 to 95° C., and more preferably from 15 to 80° C. Provided the temperature satisfies this range, the cleaning composition remains stably dissolved, and stable cleaning effects are achieved relative to organic soiling and particulate soiling.

In those cases where ultrasonic treatment is performed during the rinsing step, there are no particular restrictions on the ultrasonic treatment conditions employed, and an oscillation frequency for the ultrasonic oscillator and an ultrasonic treatment time similar to those employed within the aforementioned ultrasonic treatment step may be used.

Further, there are no particular restrictions on the temperature of the pure water (and preferably ultra pure water) during the rinsing step.

As described above, the method of cleaning a substrate for an electronic device according to the present invention is capable of removing both organic soiling and particulate soiling adhered to the substrate for an electronic device with a high degree of cleanliness, and also has a reduced impact on the environment.

In the method of cleaning a substrate for an electronic device according to the present invention, unlike the "RCA cleaning" mentioned above, large amounts of ultra pure water need not be used to perform multiple rinsing treatments between the plurality of cleaning steps, but rather, a single batch immersion treatment may be performed, meaning the number of rinsing treatments can be reduced, and the impact on the environment is minimal. Further, the method is also simple to perform.

Moreover, by using the method of cleaning a substrate for an electronic device according to the present invention, organic soiling and particulate soiling adhered to a substrate for an electronic device can be removed with an extremely high degree of cleanliness without using a high concentration of a strong acid or alkali, and without using hydrofluoric acid, which is a highly toxic aqueous solution. Furthermore, because there is no necessity to use reagents such as high-concentration strong acids, high-concentration alkalis or toxic hydrofluoric acid, the workability of the cleaning operation can be improved, and corrosion-resistant facilities and exhaust facilities are unnecessary.

Moreover, by using the method of cleaning a substrate for an electronic device according to the present invention, organic soiling and particulate soiling can be removed simultaneously, and precision cleaning can be performed without damaging the substrate for an electronic device.

Furthermore, the method of cleaning a substrate for an electronic device according to the present invention preferably includes a step of performing cleaning using an acid following completion of the cleaning using the cleaning composition of the present invention described above. By performing cleaning using an acid following removal of the organic soiling and particulate soiling using the cleaning composition described above, metal soiling adhered to the substrate for an electronic device can also be removed with an extremely high degree of cleanliness.

The acid used may be either an organic acid or an inorganic acid, although from the viewpoints of achieving a superior removal effect for the metal soiling and ensuring minimal residue of the acid itself on the electronic device substrate, an inorganic acid is preferred. Specific examples of this inorganic acid include sulfuric acid, hydrochloric acid, nitric acid, hydrofluoric acid, and mixtures thereof.

There are no particular restrictions on the concentration of the acid used, provided it is sufficient to enables removal of any metal soiling.

Further, in terms of improving the metal soiling removal efficiency, a chelating agent is preferably also used during the cleaning using an acid. There are no particular restrictions on this chelating agent, and for example, the chelating agents described above in relation to the component (B) may be used.

In the method of cleaning a substrate for an electronic device according to the present invention, even in those cases where the method includes a step of performing cleaning using an acid, a high concentration of a strong acid or hydrofluoric acid need not be used during removal of organic soiling and particulate soiling, and therefore the total amount of acid used can be reduced considerably compared with conventional "RCA cleaning" or the like, thereby reducing the impact on the environment.

Accordingly, the present invention is able to provide a novel precision cleaning method capable of replacing conventional cleaning methods within the field of industrial precision cleaning.

EXAMPLES

A more detailed description of the present invention is presented below using a series of examples, although the present invention is in no way limited by the following examples. Unless stated otherwise, the units "%" represent "% by mass".

Examples 1 to 26

Comparative Examples 1 to 6

Preparation (1) of Cleaning Compositions

Cleaning compositions having the formulations listed in Tables 1 to 4 (but excluding example 26) were prepared by normal methods, in the manner described below.

A quartz beaker (diameter: 60 mm, height: 70 mm) containing a magnetic stirrer was charged with a predetermined amount of ultra pure water, the temperature was adjusted to 25° C., and with the magnetic stirrer undergoing constant rotation, predetermined amounts of a chelating agent (B), a peroxide (C), TMAH, and a water-soluble salt (A) containing a transition metal were added sequentially to form a cleaning composition.

Further, the cleaning composition of example 26 was also prepared by normal methods, in the manner described below.

A quartz beaker (diameter: 60 mm, height: 70 mm) containing a magnetic stirrer was charged with a predetermined amount of ultra pure water, the temperature was adjusted to 25° C., and with the magnetic stirrer undergoing constant rotation, predetermined amounts of a chelating agent (B) C1 and a water-soluble salt (A) M1 containing a transition metal were added and mixed to obtain an aqueous solution (hereafter referred to as the "metal complex aqueous solution").

When the absorbance of this aqueous solution was measured using a spectrometer (product name: MultiSpec-1500, manufactured by Shimadzu Corporation), the appearance of a new peak in the wavelength vicinity of 310 nm that was not observed in either the aqueous solution of C1 or the aqueous solution of M1 confirmed the formation of a complex between C1 and M1.

TMAH and a peroxide (C) were then added sequentially to this metal complex aqueous solution to complete preparation of the cleaning composition.

The units for the blend amounts listed in Tables 1 to 4 are "% by mass", and the blend amount of each component represents the equivalent amount of the pure component.

In the tables, the term "balance" refers to the amount of ultra pure water that is added to the cleaning composition to make the total amount of all of the components within the cleaning composition up to a value of 100% by mass.

In the tables, "(A)+(B) [% by mass]" represents the combined amount [% by mass] of the component (A) and the component (B) within the cleaning composition.

Further, in the tables, "(B)/(A) [molar ratio]" represents the ratio (of molar equivalents) of the component (B) relative to the component (A).

Descriptions of the components listed in the tables are provided below.

[Description of Components Listed in Tables]
Water-Soluble Salt (A) Containing a Transition Metal
  M1: copper sulfate pentahydrate (Kanto Chemical Co., Inc., first grade)
  M2: iron sulfate heptahydrate (Kanto Chemical Co., Inc., special grade)
  M3: manganese sulfate pentahydrate (Kanto Chemical Co., Inc., special grade)
  M4: cobalt sulfate heptahydrate (Wako Pure Chemical Industries, Ltd.)
  M5: nickel sulfate hexahydrate (Junsei Chemical Co., Ltd., special grade)
  M6: silver sulfate (Kanto Chemical Co., Inc., first grade)
  M7: copper (II) chloride dihydrate (Kanto Chemical Co., Inc., first grade)
  M8: copper (II) nitrate trihydrate (Kanto Chemical Co., Inc., first grade)
  M9: calcium chloride dihydrate (Kanto Chemical Co., Inc., special grade), used as a comparative component for the component (A)
Chelating Agent (B)
  C1: tetrasodium iminodisuccinate (IDS-4Na, manufactured by Lanxess AG)
  C2: tetrasodium hydroxyiminodisuccinate (HIDS-4Na, manufactured by Nippon Shokubai Co., Ltd.)
  C3: trisodium methylglycinediacetate (MGDA-3Na, product name: Trilon M, manufactured by BASF Corporation)
  C4: tetrasodium L-glutamic acid diacetate (GLDA-4Na, manufactured by Chelest Corporation)
  C5: tetrasodium L-aspartic acid N,N-diacetate (ASDA-4Na, manufactured by Mitsubishi Rayon Co., Ltd.)
  C6: trisodium citrate dihydrate (Kanto Chemical Co., Inc., first grade)
  C7: sodium tripolyphosphate (Kanto Chemical Co., Inc., first grade)
  C8: sodium hydroxyethane diphosphonate (product name: BRIQUEST ADPA-60SH, manufactured by Rhodia Group)
  C9: maleic acid-acrylic acid copolymer (product name: SOKALAN CP7, manufactured by BASF Corporation)
  C10: sodium salt of carboxymethylated polyethyleneimine (product name: Trilon P, manufactured by BASF Corporation)
  C11: sodium acetate (Wako Pure Chemical Industries, Ltd., special grade), used as a comparative component for the component (B)
Peroxide (C)
  Hydrogen peroxide: Kanto Chemical Co., Inc., special grade
Other Components
  TMAH: tetramethylammonium hydroxide (product name: TMAH-20H, manufactured by Toyo Gosei Co., Ltd.)
  Ultra pure water: produced using an apparatus GSR-200 (product name) manufactured by Advantec Toyo Kaisha, Ltd. This ultra pure water had a specific resistance at 25° C. of 18 MΩ·cm.

<Measurement of pH of Cleaning Compositions>

In the <preparation (1) of cleaning compositions> described above, after final addition of the component (A) (or after final addition of the component (C) in example 26), the resulting composition was mixed for 10 seconds, and 10 mL of the resulting cleaning composition was immediately placed in a sample bottle. The sample was left to stand with no lid for 10 minutes at 25° C., and the pH of the cleaning composition (the neat liquid) was then measured.

Measurement of the pH was conducted using a pH meter (product name: HM-20S, manufactured by DKK TOA Corporation) and a pH electrode (product name: GST-5211C, manufactured by DKK TOA Corporation), by immersing the pH electrode in the cleaning composition at approximately 25° C., and reading the display value 15 seconds after immersion.

<Evaluation of Degree of Cleanliness Relative to Organic Soiling and Particulate Soiling>

In order to evaluate the degree of cleanliness relative to organic soiling and particulate soiling, the cleaning composition was prepared in accordance with <preparation (1) of cleaning compositions> described above, and after final addition of the component (A) (or after final addition of the component (C) in example 26), the resulting composition was mixed for 10 seconds, and the resulting cleaning composition was then immediately used to perform the cleaning tests described below.

[Cleaning Tests]

(Substrate for Electronic Device)

As a semiconductor substrate, a mirror-polished uncleaned Si substrate (manufactured by KN Platz Co., Ltd.) that had been cut to dimensions of 5 cm×2 cm was used.

(Cleaning Method)

One of the above cut Si substrates was secured at an angle inside a 100 mL quartz beaker so as not to make contact with the bottom surface of the quartz beaker, and 50 mL of the cleaning composition from one of the examples was added. Subsequently, the temperature was adjusted to 50° C., and cleaning was performed for 10 minutes while an ultrasonic treatment was conducted by generating ultrasonic waves of 600 kHz.

Following cleaning, the substrate was rinsed for 30 seconds under running ultra pure water, and was then dried under a stream of nitrogen to obtain a Si substrate for evaluation.

[Evaluation of Degree of Cleanliness Relative to Organic Soiling]

2 µL of the ultra pure water mentioned above was dripped onto the surface of the Si substrate for evaluation obtained above, and a contact angle meter (product name: Contact angle meter CA-X, manufactured by Kyowa Interface Science Co., Ltd.) was used to measure the contact angle at 25° C. Here, the "contact angle" refers to the static contact angle, namely the angle between the surface of the Si substrate for evaluation and the surface of the water droplet sitting on the horizontal Si substrate for evaluation.

Using the measured contact angle as an indicator, the degree of cleanliness relative to organic soiling was evaluated against the evaluation criteria listed below. The results are shown in the tables.

The contact angle for the mirror-polished uncleaned Si substrate prior to cleaning with the cleaning composition of one of the examples was 42 degrees.

Evaluation Criteria

⊚ ⊚: 7 degrees or less
⊚: greater than 7 degrees but not more than 15 degrees
○: greater than 15 degrees but not more than 25 degrees
Δ: greater than 25 degrees but not more than 35 degrees
x: greater than 35 degrees

[Evaluation of Degree of Cleanliness Relative to Particulate Soiling]

The surface of the Si substrate for evaluation obtained above was inspected using a scanning probe microscope (AFM) (product name: SPM-9500J3, manufactured by Shimadzu Corporation), and a visual evaluation was used to measure the number of particles having a diameter of 5 nm or greater detected within an area of 30 µm×30 µm on the surface of the Si substrate for evaluation.

Using this measured number of particles as an indicator, the degree of cleanliness relative to particulate soiling was evaluated against the evaluation criteria listed below. The results are shown in the tables.

The number of particles on the mirror-polished uncleaned Si substrate prior to cleaning with the cleaning composition of one of the examples was approximately 500.

Evaluation Criteria

Figure 1B:
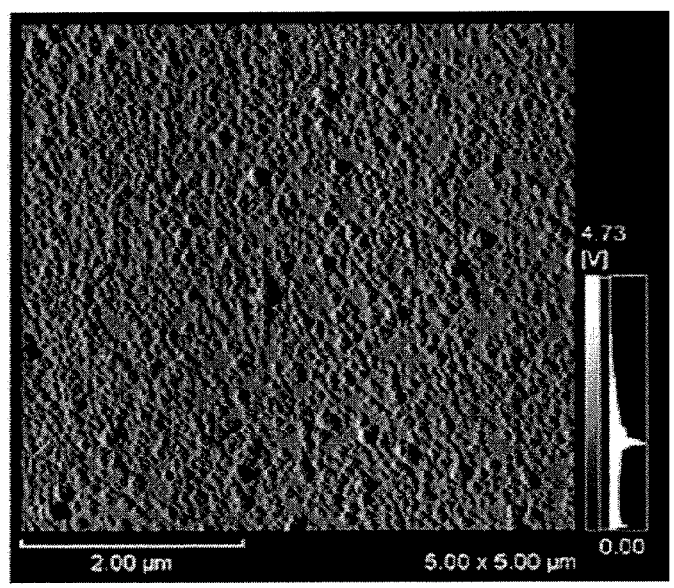
FIG. 1B is a diagram illustrating a phase difference image of an AFM observation image of an uncleaned Si substrate following a mirror polishing treatment.

⊚ ⊚: 0 to 10 particles
⊚: 11 to 50 particles
○: 51 to 100 particles
Δ: 101 to 200 particles
x: greater than 201 particles FIG. 1A and FIG. 1B illustrate AFM observation images of the mirror-polished uncleaned Si substrate.

FIG. 1A is a shape image and FIG. 1B is a phase difference image.

In an AFM observation, the hardness or softness of the surface under observation can be determined on the basis of the delay in the phase of the oscillation of the cantilever fitted to the AFM. In the phase difference image, organic matter is soft and therefore appears as black areas, whereas inorganic matter is soft and therefore appears white.

Accordingly, this AFM observation can be used to confirm the existence of organic matter (organic soiling) and inorganic matter (particulate soiling) on the Si substrate.

TABLE 1

| | Example | | | | | | | | | |
|---|---|---|---|---|---|---|---|---|---|---|
| | 1 | 2 | 3 | 4 | 5 | 6 | 7 | 8 | 9 | 10 |
| (A) water-soluble salt | M1 | M1 | M1 | M1 | M1 | M1 | M1 | M1 | M1 | M1 |
| (B) chelating agent | C1 | C2 | C3 | C4 | C5 | C6 | C7 | C8 | C9 | C10 |
| (A) + (B) [% by mass] | 0.1 | 0.1 | 0.1 | 0.1 | 0.1 | 0.1 | 0.1 | 0.1 | 0.1 | 0.1 |
| (C) peroxide | 1.0 | 1.0 | 1.0 | 1.0 | 1.0 | 1.0 | 1.0 | 1.0 | 1.0 | 1.0 |
| TMAH | 0.5 | 0.5 | 0.5 | 0.5 | 0.5 | 0.5 | 0.5 | 0.5 | 0.5 | 0.5 |
| Ultra pure water | balance | balance | balance | balance | balance | balance | balance | balance | balance | balance |
| (B)/(A) [molar ratio] | 1.0 | 1.0 | 1.0 | 1.0 | 1.0 | 1.0 | 1.0 | 1.0 | 1.0 | 1.0 |
| pH of cleaning composition | 11.5 | 11.7 | 11.4 | 11.4 | 11.4 | 11.6 | 11.2 | 11.4 | 11.4 | 11.6 |
| Degree of cleanliness relative to organic soiling | ⊚ ⊚ | ⊚ ⊚ | ⊚ ⊚ | ⊚ ⊚ | ⊚ ⊚ | ⊚ ⊚ | ⊚ | ⊚ | ⊚ | ⊚ |
| Degree of cleanliness relative to particulate soiling | ⊚ ⊚ | ⊚ ⊚ | ⊚ ⊚ | ⊚ ⊚ | ⊚ ⊚ | ⊚ ⊚ | ⊚ | ⊚ | ⊚ ⊚ | ⊚ ⊚ |

TABLE 2

| | Example | | | | | | | | | |
|---|---|---|---|---|---|---|---|---|---|---|
| | 11 | 12 | 13 | 14 | 15 | 16 | 17 | 18 | 19 | 20 |
| (A) water-soluble salt | M2 | M3 | M4 | M5 | M6 | M7 | M8 | M1 | M1 | M1 |
| (B) chelating agent | C1 | C1 | C1 | C1 | C1 | C1 | C1 | C1 | C1 | C1 |
| (A) + (B) [% by mass] | 0.1 | 0.1 | 0.1 | 0.1 | 0.01 | 0.1 | 0.1 | 0.01 | 1.0 | 0.1 |
| (C) peroxide | 1.0 | 1.0 | 1.0 | 1.0 | 1.0 | 1.0 | 1.0 | 1.0 | 1.0 | 0.1 |
| TMAH | 0.5 | 0.5 | 0.5 | 0.5 | 0.5 | 0.5 | 0.5 | 0.5 | 0.5 | 0.5 |
| Ultra pure water | balance | balance | balance | balance | balance | balance | balance | balance | balance | balance |
| (B)/(A) [molar ratio] | 1.0 | 1.0 | 1.0 | 1.0 | 1.0 | 1.0 | 1.0 | 1.0 | 1.0 | 1.0 |
| pH of cleaning composition | 11.6 | 11.0 | 10.9 | 11.8 | 10.2 | 11.4 | 11.5 | 11.8 | 10.6 | 11.7 |
| Degree of cleanliness relative to organic soiling | ◎ ◎ | ◎ ◎ | ◎ ◎ | ◎ ◎ | ◎ ◎ | ◎ ◎ | ◎ ◎ | ◎ ◎ | ◎ ◎ | ◎ |
| Degree of cleanliness relative to particulate soiling | ◎ ◎ | ◎ ◎ | ◎ ◎ | ◎ | ◎ | ◎ ◎ | ◎ ◎ | ◎ | ◎ ◎ | ◎ ◎ |

TABLE 3

| | Example | | | | | |
|---|---|---|---|---|---|---|
| | 21 | 22 | 23 | 24 | 25 | 26 |
| (A) water-soluble salt | M1 | M1 | M1 | M1 | M1 | M1 |
| (B) chelating agent | C1 | C1 | C1 | C1 | C1 | C1 |
| (A) + (B) [% by mass] | 0.1 | 0.1 | 0.1 | 0.1 | 0.005 | 0.1 |
| (C) peroxide | 5.0 | 1.0 | 1.0 | 1.0 | 1.0 | 1.0 |
| TMAH | 0.5 | 0.5 | 0.5 | 0.03 | 0.5 | 0.5 |
| Ultra pure water | balance | balance | balance | balance | balance | balance |
| (B)/(A) [molar ratio] | 1.0 | 0.5 | 2.0 | 1.0 | 1.0 | 1.0 |
| pH of cleaning composition | 11.0 | 10.8 | 11.6 | 8.3 | 11.8 | 11.6 |
| Degree of cleanliness relative to organic soiling | ◎ ◎ | ◎ ◎ | ◎ | ◎ | ○ | ◎ ◎ |
| Degree of cleanliness relative to particulate soiling | ◎ ◎ | ◎ | ◎ ◎ | ○ | Δ | ◎ ◎ |

TABLE 4

| | Comparative example | | | | | |
|---|---|---|---|---|---|---|
| | 1 | 2 | 3 | 4 | 5 | 6 |
| (A) water-soluble salt | M1 | M9 | — | M1 | M1 | M1 |
| (B) chelating agent | C11 | C1 | C1 | — | C1 | C1 |
| (A) + (B) [% by mass] | 0.1 | 0.1 | 0.1 | 0.1 | 0.1 | 0.1 |
| (C) peroxide | 1.0 | 1.0 | 1.0 | 1.0 | — | — |
| TMAH | 0.5 | 0.5 | 0.5 | 0.5 | 0.5 | 0.5 |
| Ultra pure water | balance | balance | balance | balance | balance | balance |
| (B)/(A) [molar ratio] | 1.0 | 1.0 | — | — | 1.0 | 0.1 |
| pH of cleaning composition | 11.4 | 11.8 | 11.8 | 11.2 | 11.8 | 10.2 |
| Degree of cleanliness relative to organic soiling | ○ | Δ | Δ | Δ | X | Δ |
| Degree of cleanliness relative to particulate soiling | X | X | X | X | X | X |

As is evident from the above results, by using the cleaning compositions according to examples 1 to 26 of the present invention and a cleaning method that employs these cleaning compositions, it was confirmed that both organic soiling and particulate soiling adhered to the Si substrate used as an example of an electronic device substrate were able to be removed with a high degree of cleanliness.

Furthermore, by using the cleaning compositions according to examples 1 to 26 of the present invention and a cleaning method that employs these cleaning compositions, high-concentration strong acid, high-concentration alkali and toxic hydrofluoric acid need not be used, and only a single rinsing treatment with ultra pure water is required, resulting in a reduced impact on the environment.

Examples 27 to 33

Evaluation of Degree of Cleanliness Relative to Metal Soiling

In order to evaluate the degree of cleanliness relative to metal soiling, the cleaning composition of example 1 was prepared in accordance with <preparation (1) of cleaning compositions> described above, and after final addition of the component (A), the resulting cleaning composition was mixed for 10 seconds, and then immediately used to perform the cleaning test described below.

[Cleaning Test]

(Preparation of Acid Cleaning Agents)

The acidic aqueous solutions having the formulations listed in Table 5 were used as acid cleaning agents. The units for the blend amounts listed in Table 5 are "% by mass", and the blend amount of each component represents the equivalent amount of the pure component. In the table, the term "balance" refers to the amount of ultra pure water that is added to the acid cleaning agent to make the total amount of all of the components within the acid cleaning agent up to a value of 100% by mass.

The acids used are listed below, and these acids were dissolved in ultra pure water to prepare the acid cleaning agents.

Sulfuric acid (Kanto Chemical Co., Inc., Ultrapur-100)
Nitric acid (Kanto Chemical Co., Inc., Ultrapur-100)
Hydrochloric acid (Kanto Chemical Co., Inc., Ultrapur-100)
Hydrofluoric acid (Kanto Chemical Co., Inc., Ultrapur-100)

(Substrate for Electronic Device)

As a semiconductor substrate, a mirror-polished uncleaned Si substrate (manufactured by KN Platz Co., Ltd.) that had been cut to dimensions of 5 cm×5 cm was used.

(Cleaning Method)

The cut Si substrate of dimensions 5 cm×5 cm was mounted on a fluororesin dipper and placed inside a fluororesin beaker of capacity 1,000 ml, and 700 mL of the cleaning composition of example 1 was added. Subsequently, the temperature was adjusted to 50° C., and immersion cleaning was performed for 10 minutes. Following cleaning, the Si substrate was removed from the beaker and rinsed for 30 seconds under running ultra pure water. The Si substrate was then placed in another fluororesin beaker of capacity 1,000 ml, and 700 ml of one of the acid cleaning agents listed in Table 5 was added. The temperature was adjusted to 50° C., and immersion cleaning was performed for 10 minutes. Following cleaning, the Si substrate was removed from the beaker and then rinsed for one minute in running ultra pure water by immersing the substrate in yet another fluororesin beaker of capacity 1,000 ml filled with ultra pure water, while additional ultra pure water was added to the beaker to cause a state of continuous overflow. Subsequently, the Si substrate was removed from the beaker, and then immersed in yet another fluororesin beaker of capacity 1,000 ml filled with isopropyl alcohol (Kanto Chemical Co., Inc., EL) that had been heated to 50° C. The Si substrate was then gradually pulled up out of the isopropyl alcohol at a rate of 1 cm/minute and dried, yielding a Si substrate for evaluation.

[Evaluation of Degree of Cleanliness Relative to Metal Soiling]

Evaluation of the degree of cleanliness relative to metal soiling was conducted using a benchtop total reflection X-ray fluorescence spectrometer NANOHUNTER (product name) manufactured by Rigaku Corporation, by determining the amount of residual copper atoms on the surface of the Si substrate for evaluation, and evaluating the amount against the evaluation criteria listed below. The results are shown in the table.

The amount of copper atoms on the uncleaned Si substrate for evaluation prior to cleaning with the acid cleaning agent of one of the examples was approximately $9 \times 10^{15}$ copper atoms/cm$^2$ (namely, greater than $1 \times 10^{15}$ copper atoms/cm$^2$). Determination of the amount of copper atoms was performed by creating a calibration curve using Si standard samples containing known amounts of adhered copper atoms.

Evaluation Criteria

⊚ ⊚: $1 \times 10^{12}$ copper atoms/cm$^2$ or less (less than the lower limit of determination)

⊚: greater than $1 \times 10^{12}$ copper atoms/cm$^2$ but not more than $1 \times 10^{13}$ copper atoms/cm$^2$ ○: greater than $1 \times 10^{13}$ copper atoms/cm$^2$ but not more than $1 \times 10^{14}$ copper atoms/cm$^2$ Δ: greater than $1 \times 10^{14}$ copper atoms/cm$^2$ but not more than $1 \times 10^{15}$ copper atoms/cm$^2$ x: greater than $1 \times 10^{15}$ copper atoms/cm$^2$

TABLE 5

| | Example | | | | | | |
|---|---|---|---|---|---|---|---|
| | 27 | 28 | 29 | 30 | 31 | 32 | 33 |
| Sulfuric acid | 20 | 10 | 40 | 20 | | | |
| Nitric acid | 20 | 10 | | | 20 | | |
| Hydrochloric acid | | | | | | 20 | |
| Hydrofluoric acid | | | | | | | 2 |
| Ultra pure water | balance | balance | balance | balance | balance | balance | balance |
| Degree of cleanliness relative to metal soiling | ⊚ ⊚ | ⊚ | ⊚ | ⊚ | ○ | ⊚ | ⊚ ⊚ |

The results in Table 5 confirmed that by using the cleaning method of examples 27 to 33, which included a step of cleaning using an acid following the cleaning step using the cleaning composition of example 1 according to the present invention, metal soiling adhered to the Si substrate used as an example of an electronic device substrate was able to be removed with a high degree of cleanliness.

Examples 34 to 54

Comparative Examples 7 to 12

Preparation (2) of Cleaning Compositions

Cleaning compositions having the formulations listed in Tables 6 to 9 (but excluding example 54) were prepared by normal methods, in the manner described below.

A fluororesin beaker (diameter: 60 mm, height: 70 mm) containing a magnetic stirrer was charged with a predetermined amount of ultra pure water, the temperature was adjusted to 25° C., and with the magnetic stirrer undergoing constant rotation, predetermined amounts of a chelating agent (B), a peroxide (C), an alkali agent, and a water-soluble salt (A) containing a transition metal were added sequentially to form a cleaning composition.

Further, the cleaning composition of example 54 was also prepared by normal methods, in the manner described below.

A quartz beaker (diameter: 60 mm, height: 70 mm) containing a magnetic stirrer was charged with a predetermined amount of ultra pure water, the temperature was adjusted to 25° C., and with the magnetic stirrer undergoing constant rotation, predetermined amounts of a chelating agent (B) C1 and a water-soluble salt (A) M1 containing a transition metal were added and mixed to obtain a metal complex aqueous solution.

NaOH and a peroxide (C) were then added sequentially to this metal complex aqueous solution to complete preparation of the cleaning composition.

The units for the blend amounts listed in Tables 6 to 9 are "% by mass", and the blend amount of each component represents the equivalent amount of the pure component.

In the tables, the terms "balance", "(A)+(B) [% by mass]" and "(B)/(A) [molar ratio]" are as defined above.

Descriptions of the components listed in the tables are provided below.

[Description of Components Listed in Tables]

Of the components listed in Tables 6 to 9, those having the same letters and numbers as components listed in Tables 1 to 4 refer to the same components.

Chelating Agent (B)

C12: trisodium nitrilotriacetate (Trilon A, manufactured by BASF Corporation)

Other Components

NaOH: sodium hydroxide (Kanto Chemical Co., Inc., UGR)

KOH: potassium hydroxide (Kanto Chemical Co., Inc., UGR)

<Measurement of pH of Cleaning Compositions>

The pH of the cleaning composition of each of the examples listed in Tables 6 to 9 was measured in the same manner as the pH measurements described above.

<Evaluation of Degree of Cleanliness Relative to Organic Soiling and Particulate Soiling>

In order to evaluate the degree of cleanliness relative to organic soiling and particulate soiling, the cleaning composition was prepared in accordance with <preparation (2) of cleaning compositions> described above, and after final addition of the component (A) (or after final addition of the component (C) in example 54), the resulting composition was mixed for 10 seconds, and the resulting cleaning composition was then immediately used to perform the cleaning tests described below.

[Cleaning Tests]

(Substrate for Electronic Device)

A silicon carbide substrate (manufactured by Nippon Steel Corporation, 2-inches, product name: Polytype 4H, Si surface finish: polished) was secured to a polishing mount using a wax (product name: ALCOWAX manufactured by Nikka Seiko Co., Ltd.).

Using a polishing device (product names: AutoMet 2000, EcoMet 3000, manufactured by Buehler) a colloidal silica polishing slurry (product name: MasterMet, manufactured by Buehler) was dripped onto the polishing buff, (product name: MasterTex, manufactured by Buehler), and the substrate was polished for 2 minutes while a loading of 5 pounds was applied.

The silicon carbide substrate was then removed from the polishing mount, washed under 100 ml of running ultra pure water, and dried, completing preparation of a soiled silicon carbide substrate.

As the semiconductor substrate, segments of this soiled silicon carbide substrate cut to dimensions of 1 cm×1 cm were used.

(Cleaning Method)

The cut soiled silicon carbide substrate was secured at an angle inside a 7 mL quartz cell so as not to make contact with the bottom surface or side surfaces of the quartz cell, and 5 mL of the cleaning composition from one of the examples was then added to the cell. The temperature was then adjusted to 80° C., and immersion cleaning was performed for 30 minutes.

Following cleaning, the substrate was rinsed for 30 seconds under running ultra pure water, and was then dried under a stream of nitrogen to obtain a silicon carbide substrate for evaluation.

[Evaluation of Degree of Cleanliness Relative to Organic Soiling]

With the exception of using the silicon carbide substrate for evaluation instead of the Si substrate for evaluation, the contact angle at 25° C. was measured in the same manner as that described above.

Using the measured contact angle as an indicator, the degree of cleanliness relative to organic soiling was evaluated against the evaluation criteria listed below. The results are shown in the tables.

The contact angle for the uncleaned soiled silicon carbide substrate prior to cleaning with the cleaning composition of one of the examples was 70 degrees.

Evaluation Criteria

⊚ ◉: 45 degrees or less

◎: greater than 45 degrees but not more than 50 degrees

○: greater than 50 degrees but not more than 55 degrees

Δ: greater than 55 degrees but not more than 60 degrees x: greater than 60 degrees

[Evaluation of Degree of Cleanliness Relative to Particulate Soiling]

With the exception of using the silicon carbide substrate for evaluation instead of the Si substrate for evaluation, the number of particles having a diameter of 5 nm or greater detected within an area of 30 μm×30 μm on the surface of the silicon carbide substrate for evaluation was measured in the same manner as that described above.

Using this measured number of particles as an indicator, the degree of cleanliness relative to particulate soiling was evaluated against the evaluation criteria listed below. The results are shown in the tables.

The number of particles on the uncleaned soiled silicon carbide substrate prior to cleaning with the cleaning composition of one of the examples was approximately 500.

Evaluation Criteria

⊚ ◉: 0 to 10 particles

◎: 11 to 50 particles

○: 51 to 100 particles

Δ: 101 to 200 particles x: greater than 201 particles

TABLE 6

|  | Example 34 | Example 35 | Example 36 | Example 37 | Example 38 | Example 39 | Example 40 | Example 41 | Example 42 | Example 43 |
|---|---|---|---|---|---|---|---|---|---|---|
| (A) water-soluble salt | M1 | M1 | M1 | M1 | M1 | M3 | M3 | M3 | M3 | M3 |
| (B) chelating agent | C1 | C2 | C3 | C6 | C12 | C1 | C2 | C3 | C6 | C12 |
| (A) + (B) [% by mass] | 0.1 | 0.1 | 0.1 | 0.1 | 0.1 | 0.03 | 0.03 | 0.03 | 0.03 | 0.03 |
| (C) peroxide | 25.0 | 25.0 | 25.0 | 25.0 | 25.0 | 25.0 | 25.0 | 25.0 | 25.0 | 25.0 |
| NaOH | 2.0 | 2.0 | 2.0 | 2.0 | 2.0 | 2.0 | 2.0 | 2.0 | 2.0 | 2.0 |
| Ultra pure water | balance | balance | balance | balance | balance | balance | balance | balance | balance | balance |
| (B)/(A) [molar ratio] | 1.0 | 1.0 | 1.0 | 1.0 | 1.0 | 1.0 | 1.0 | 1.0 | 1.0 | 1.0 |
| pH of cleaning composition | 9.6 | 9.8 | 9.6 | 9.6 | 9.9 | 9.0 | 9.2 | 9.2 | 9.1 | 8.9 |
| Degree of cleanliness relative to organic soiling | ⊚⊚ | ⊚⊚ | ⊚⊚ | ⊚ | ○ | ⊚⊚ | ⊚ | ⊚ | ⊚ | ○ |
| Degree of cleanliness relative to particulate soiling | ⊚⊚ | ⊚⊚ | ⊚⊚ | ⊚ | ○ | ⊚⊚ | ⊚ | ⊚ | ⊚ | Δ |

TABLE 7

|  | Example 44 | Example 45 | Example 46 | Example 47 | Example 48 |
|---|---|---|---|---|---|
| (A) water-soluble salt | M4 | M4 | M4 | M4 | M4 |
| (B) chelating agent | C1 | C2 | C3 | C6 | C12 |
| (A) + (B) [% by mass] | 0.03 | 0.03 | 0.03 | 0.03 | 0.03 |
| (C) peroxide | 25.0 | 25.0 | 25.0 | 25.0 | 25.0 |
| NaOH | 2.0 | 2.0 | 2.0 | 2.0 | 2.0 |
| KOH |  |  |  |  |  |
| TMAH |  |  |  |  |  |
| Ultra pure water | balance | balance | balance | balance | balance |
| (B)/(A) [molar ratio] | 1.0 | 1.0 | 1.0 | 1.0 | 1.0 |
| pH of cleaning composition | 8.9 | 9.3 | 9.2 | 8.9 | 8.8 |
| Degree of cleanliness relative to organic soiling | ⊚⊚ | ⊚ | ⊚⊚ | ⊚ | ○ |
| Degree of cleanliness relative to particulate soiling | ⊚⊚ | ⊚⊚ | ○ | ⊚ | ○ |

TABLE 8

|  | Example 49 | Example 50 | Example 51 | Example 52 | Example 53 | Example 54 |
|---|---|---|---|---|---|---|
| (A) water-soluble salt | M1 | M1 | M1 | M1 | M1 | M1 |
| (B) chelating agent | C1 | C1 | C1 | C1 | C1 | C1 |
| (A) + (B) [% by mass] | 0.1 | 0.1 | 0.01 | 0.1 | 0.1 | 0.1 |
| (C) peroxide | 25.0 | 25.0 | 25.0 | 30.0 | 5.0 | 25.0 |
| NaOH |  |  | 2.0 | 2.0 | 2.0 | 2.0 |
| KOH | 2.0 |  |  |  |  |  |
| TMAH |  | 2.0 |  |  |  |  |
| Ultra pure water | balance | balance | balance | balance | balance | balance |
| (B)/(A) [molar ratio] | 1.0 | 1.0 | 1.0 | 1.0 | 1.0 | 1.0 |
| pH of cleaning composition | 9.4 | 8.1 | 10.5 | 9.5 | 10.4 | 9.6 |
| Degree of cleanliness relative to organic soiling | ⊚⊚ | ⊚ | Δ | ⊚⊚ | Δ | ⊚⊚ |
| Degree of cleanliness relative to particulate soiling | ⊚⊚ | ○ | Δ | ⊚⊚ | ○ | ⊚⊚ |

TABLE 9

|  | Comparative example 7 | Comparative example 8 | Comparative example 9 | Comparative example 10 | Comparative example 11 | Comparative example 12 |
|---|---|---|---|---|---|---|
| (A) water-soluble salt | M1 | M9 | — | M1 | M1 | M1 |
| (B) chelating agent | C11 | C1 | C1 | — | C1 | C1 |
| (A) + (B) [% by mass] | 0.1 | 0.1 | 0.1 | 0.1 | 0.1 | 0.1 |
| (C) peroxide | 25.0 | 25.0 | 25.0 | 25.0 | — | 25.0 |
| NaOH | 2.0 | 2.0 | 2.0 | 2.0 | 2.0 | 2.0 |
| Ultra pure water | balance | balance | balance | balance | balance | balance |
| (B)/(A) [molar ratio] | 1.0 | 1.0 | — | — | 1.0 | 0.1 |
| pH of cleaning composition | 10.1 | 13.8 | 13.8 | 10.2 | 13.8 | 9.9 |

TABLE 9-continued

|  | Comparative example | | | | | |
| --- | --- | --- | --- | --- | --- | --- |
|  | 7 | 8 | 9 | 10 | 11 | 12 |
| Degree of cleanliness relative to organic soiling | Δ | X | Δ | ◯ | X | Δ |
| Degree of cleanliness relative to particulate soiling | X | X | X | X | X | X |

As is evident from the results in Tables 6 to 9, by using the cleaning compositions according to examples 34 to 54 of the present invention and a cleaning method that employs these cleaning compositions, it was confirmed that both organic soiling and particulate soiling adhered to the silicon carbide substrate used as an example of an electronic device substrate were able to be removed with a high degree of cleanliness.

Furthermore, by using the cleaning compositions according to examples 34 to 54 of the present invention and a cleaning method that employs these cleaning compositions, high-concentration strong acid, high-concentration alkali and toxic hydrofluoric acid need not be used, and only a single rinsing treatment with ultra pure water is required, resulting in a reduced impact on the environment.

Examples 55 to 61

Evaluation of Degree of Cleanliness Relative to Metal Soiling

In order to evaluate the degree of cleanliness relative to metal soiling, the cleaning composition of example 34 was prepared in accordance with <preparation (2) of cleaning compositions> described above, and after final addition of the component (A), the resulting cleaning composition was mixed for 10 seconds, and then immediately used to perform the cleaning test described below.

[Cleaning Test]

(Preparation of Acid Cleaning Agents)

The acidic aqueous solutions having the formulations listed in Table 10 were used as acid cleaning agents. These acidic aqueous solutions were prepared in the same manner as the acidic aqueous solutions shown above in Table 5.

(Substrate for Electronic Device)

As a semiconductor substrate, an aforementioned uncleaned soiled silicone carbide substrate (size: 2 inches) was used.

(Cleaning Method)

The soiled silicone carbide substrate was mounted on a fluororesin dipper and placed inside a fluororesin beaker of capacity 1,000 ml, and 700 mL of the cleaning composition of example 34 was added. Subsequently, the temperature was adjusted to 80° C., and immersion cleaning was performed for 30 minutes. Following cleaning, the silicone carbide substrate was removed from the beaker and rinsed for 30 seconds under running ultra pure water. The silicone carbide substrate was then placed in another fluororesin beaker of capacity 1,000 ml, and 700 ml of one of the acid cleaning agents listed in Table 10 was added. The temperature was adjusted to 80° C., and immersion cleaning was performed for 10 minutes. Following cleaning, the silicon carbide substrate was removed from the beaker and then rinsed for one minute in running ultra pure water by immersing the substrate in yet another fluororesin beaker of capacity 1,000 ml filled with ultra pure water, while additional ultra pure water was added to the beaker to cause a state of continuous overflow. Subsequently, the silicon carbide substrate was removed from the beaker, and then immersed in yet another fluororesin beaker of capacity 1,000 ml filled with isopropyl alcohol (Kanto Chemical Co., Inc., EL) that had been heated to 50° C. The silicon carbide substrate was then gradually pulled up out of the isopropyl alcohol at a rate of 1 cm/minute and dried, yielding a silicon carbide substrate for evaluation.

[Evaluation of Degree of Cleanliness Relative to Metal Soiling]

With the exception of using the silicon carbide substrate for evaluation instead of the Si substrate for evaluation, the amount of residual copper atoms on the surface of the silicon carbide substrate for evaluation was determined and then evaluated against the evaluation criteria listed below in the same manner as that described above. The results are shown in the table.

The amount of copper atoms on the uncleaned silicon carbide substrate for evaluation prior to cleaning with the acid cleaning agent of one of the examples was approximately $9 \times 10^{15}$ copper atoms/cm$^2$ (namely, greater than $1 \times 10^{15}$ copper atoms/cm$^2$). Determination of the amount of copper atoms was performed by creating a calibration curve using Si standard samples containing known amounts of adhered copper atoms.

Evaluation Criteria

⊚ ⊚: $1 \times 10^{12}$ copper atoms/cm$^2$ or less (less than the lower limit of determination)

⊚: greater than $1 \times 10^{12}$ copper atoms/cm$^2$ but not more than $1 \times 10^{13}$ copper atoms/cm$^2$ ◯: greater than $1 \times 10^{13}$ copper atoms/cm$^2$ but not more than $1 \times 10^{14}$ copper atoms/cm$^2$ Δ: greater than $1 \times 10^{14}$ copper atoms/cm$^2$ but not more than $1 \times 10^{15}$ copper atoms/cm$^2$ x: greater than $1 \times 10^{15}$ copper atoms/cm$^2$

TABLE 10

|  | Example | | | | | | |
| --- | --- | --- | --- | --- | --- | --- | --- |
|  | 55 | 56 | 57 | 58 | 59 | 60 | 61 |
| Sulfuric acid | 20 | 10 | 40 | 20 |  |  |  |
| Nitric acid | 20 | 10 |  |  | 20 |  |  |

TABLE 10-continued

| | Example | | | | | | |
|---|---|---|---|---|---|---|---|
| | 55 | 56 | 57 | 58 | 59 | 60 | 61 |
| Hydrochloric acid | | | | | | 20 | |
| Hydrofluoric acid | | | | | | | 2 |
| Ultra pure water | balance | balance | balance | balance | balance | balance | balance |
| Degree of cleanliness relative to metal soiling | ◎ ◎ | ◎ | ◎ | ◎ | ○ | ◎ | ○ | ◎ ◎ |

The results in Table 10 confirmed that by using the cleaning method of examples 55 to 61, which included a step of cleaning using an acid following the cleaning step using the cleaning composition of example 34 according to the present invention, metal soiling adhered to the silicon carbide substrate used as an example of an electronic device substrate was able to be removed with a high degree of cleanliness.

INDUSTRIAL APPLICABILITY

According to the cleaning composition and method of cleaning a substrate for an electronic device according to the present invention, organic soiling and particulate soiling adhered to a substrate for an electronic device can both be removed with a high degree of cleanliness, and the impact on the environment can be reduced.

What is claimed is:

1. A cleaning composition used for cleaning a substrate for an electronic device comprising:
   a water-soluble salt (A) comprising a transition metal,
   a chelating agent (B) and
   a peroxide (C), wherein
   an amount of said chelating agent (B) is 0.5 to 10 molar equivalents relative to an amount of said water-soluble salt (A) comprising a transition metal, and wherein
   said water-soluble salt (A) comprising a transition metal is copper sulfate pentahydrate,
   and said chelating agent (B) is selected from the group consisting of tetrasodium iminodisuccinate, tetrasodium hydroxyiminodisuccinate, trisodium methylglycinediacetate, tetrasodium L-glutamic acid diacetate, tetrasodium L-aspartic acid N,N-diacetate, trisodium citrate dihydrate, sodium tripolyphosphate, sodium hydroxyethane diphosphonate, maleic acid-acrylic acid copolymer, sodium salt of carboxymethylated polyethyleneimine, and trisodium nitrilotriacetate.

2. The cleaning composition according to claim 1, wherein a pH of said composition is 8 or greater.

3. The cleaning composition according to claim 1, wherein a combined mass of said water-soluble salt (A) comprising a transition metal and said chelating agent (B) represents not less than 0.01% by mass of an entire composition.

4. The cleaning composition according to claim 1, wherein said substrate for an electronic device is a semiconductor substrate, a hard disk substrate or a display substrate.

5. The cleaning composition according to claim 4, wherein a material of said semiconductor substrate is silicon, silicon carbide, zinc oxide or sapphire.

6. The cleaning composition according to claim 4, wherein a material of said hard disk substrate is a glass, a mixture of nickel and phosphorus, a mixture of nickel and iron, or aluminum.

7. The cleaning composition according to claim 4, wherein a material of said display substrate is a glass.

8. A method of cleaning a substrate for an electronic device comprising:
   cleaning using a cleaning composition, and
   performing an ultrasonic treatment during cleaning,
   wherein the cleaning composition comprises:
      a water soluble salt (A) containing a transition metal,
      a chelating agent (B), and
      a peroxide (C),
   wherein an amount of said chelating agent (B) is not less than 0.5 molar equivalents relative to an amount of said water-soluble salt (A) containing a transition metal.

9. The method of cleaning a substrate for an electronic device according to claim 8, further comprising a step of cleaning using an acid following completion of cleaning using said cleaning composition.

10. A substrate for an electronic device, produced using the method of cleaning according to claim 8.

11. The cleaning composition according to claim 1, wherein a pH of said composition is 8 or greater.

12. The cleaning composition according to claim 1, wherein a combined mass of said water-soluble salt (A) comprising a transition metal and said chelating agent (B) represents not less than 0.01% by mass of an entire composition.

13. The cleaning composition according to claim 1, wherein said substrate for an electronic device is a semiconductor substrate, a hard disk substrate or a display substrate.

14. The method of cleaning a substrate for an electronic device according to claim 8, wherein said chelating agent (B) is a polycarboxylic acid-based compound.

15. A cleaning composition used for cleaning a substrate for an electronic device comprising:
   a water-soluble salt (A) comprising a transition metal,
   a chelating agent (B) and
   a peroxide (C), wherein
   an amount of said chelating agent (B) is 0.5 to 10 molar equivalents relative to an amount of said water-soluble salt (A) comprising a transition metal, and wherein
   said water-soluble salt (A) comprising a transition metal is selected from the group consisting of iron sulfate heptahydrate, manganese sulfate pentahydrate, cobalt sulfate heptahydrate, nickel sulfate hexahydrate, silver sulfate, copper (II) chloride dihydrate, and copper (II) nitrate trihydrate, and
   said chelating agent (B) is tetrasodium iminodisuccinate.

16. The cleaning composition according to claim 15, wherein a pH of said composition is 8 or greater.

17. The cleaning composition according to claim 15, wherein a combined mass of said water-soluble salt (A) containing a transition metal and said chelating agent (B) represents not less than 0.01% by mass of an entire composition.

18. The cleaning composition according to claim 15, wherein said substrate for an electronic device is a semiconductor substrate, a hard disk substrate or a display substrate.

19. The cleaning composition according to claim 18, wherein a material of said semiconductor substrate is silicon, silicon carbide, zinc oxide or sapphire.

20. The cleaning composition according to claim 18, wherein a material of said hard disk substrate is a glass, a mixture of nickel and phosphorus, a mixture of nickel and iron, or aluminum.

21. The cleaning composition according to claim 18, wherein a material of said display substrate is a glass.

* * * * *